United States Patent
Kim et al.

(10) Patent No.: US 8,316,279 B2
(45) Date of Patent: Nov. 20, 2012

(54) METHOD OF ESTIMATING AND CORRECTING ERRORS IN MEMORY CELLS

(75) Inventors: Jaehong Kim, Seoul (KR); Yong June Kim, Seoul (KR); Seung Hwan Song, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 435 days.

(21) Appl. No.: 12/607,768

(22) Filed: Oct. 28, 2009

(65) Prior Publication Data

US 2010/0115377 A1    May 6, 2010

(51) Int. Cl.
*G11C 29/00* (2006.01)
(52) U.S. Cl. .............................. 714/763; 365/201
(58) Field of Classification Search .................. 714/763; 365/200, 201
See application file for complete search history.

(56) References Cited

U.S. PATENT DOCUMENTS

| | | | |
|---|---|---|---|
| 6,510,537 B1 * | 1/2003 | Lee ............................... | 714/763 |
| 6,751,766 B2 | 6/2004 | Guterman et al. | |
| 7,360,136 B2 | 4/2008 | Guterman et al. | |
| 7,508,704 B2 | 3/2009 | Honma et al. | |
| 7,733,719 B2 * | 6/2010 | Lee ............................... | 365/201 |
| 7,747,926 B2 * | 6/2010 | Wise et al. .................... | 714/763 |
| 2005/0160326 A1 * | 7/2005 | Boatright et al. .............. | 714/47 |
| 2007/0011586 A1 | 1/2007 | Belogolovyi et al. | |
| 2007/0033488 A1 * | 2/2007 | Brueggen ...................... | 714/763 |
| 2008/0126908 A1 | 5/2008 | Lin | |
| 2009/0144600 A1 * | 6/2009 | Perlmutter et al. ........... | 714/763 |
| 2009/0201726 A1 | 8/2009 | Honma et al. | |

FOREIGN PATENT DOCUMENTS

| | | |
|---|---|---|
| KR | 20050027216 A | 3/2005 |
| KR | 20080004374 A | 1/2008 |

\* cited by examiner

*Primary Examiner* — Philip Guyton
(74) *Attorney, Agent, or Firm* — Volentine & Whitt, PLLC

(57) ABSTRACT

A method, implemented by at least an error correction code (ECC) decoder and a controller, estimates and corrects errors in memory cells. The method includes identifying a first candidate group of memory cells having an error-generation possibility using a first method for error estimation; identifying a second candidate group of memory cells having an error-generation possibility using a second method for error estimation; and correcting errors in at least one cell commonly included in the first and second candidate groups.

12 Claims, 12 Drawing Sheets

FIG. 1A $$\mathbf{H} \cdot \mathbf{c}^T = \underbrace{\begin{Bmatrix} h_{00} & h_{01} & h_{02} & \cdots & h_{0n-2} & h_{0n-1} \\ h_{10} & h_{11} & h_{12} & \cdots & h_{1n-2} & h_{1n-1} \\ h_{20} & h_{21} & h_{22} & \cdots & h_{2n-2} & h_{2n-1} \\ & & & \cdots & & \\ h_{M-1\,0} & h_{M-1\,1} & h_{M-1\,2} & \cdots & h_{M-1\,n-2} & h_{M-1\,n-1} \end{Bmatrix}} \cdot \underbrace{\begin{Bmatrix} c_0 \\ c_1 \\ c_2 \\ \vdots \\ c_{n-2} \\ c_{n-1} \end{Bmatrix}} = \mathbf{0}$$

FIG. 1B $$H \cdot c^T = \begin{bmatrix} h_k & h_{k-1} & h_{k-2} & \cdots & h_1 & h_0 & 0 & 0 & \cdots & 0 & 0 & 0 \\ 0 & h_k & h_{k-1} & \cdots & h_2 & h_1 & h_0 & 0 & \cdots & 0 & 0 & 0 \\ 0 & 0 & h_k & \cdots & h_3 & h_2 & h_1 & h_0 & \cdots & 0 & 0 & 0 \\ \vdots & \vdots & \vdots & & \vdots & \vdots & \vdots & \vdots & & \vdots & \vdots & \vdots \\ 0 & 0 & 0 & \cdots & 0 & h_{k-1} & h_k & \cdots & h_2 & h_1 & h_0 \end{bmatrix} \cdot \begin{bmatrix} c_0 \\ c_1 \\ c_2 \\ \vdots \\ c_{n-2} \\ c_{n-1} \end{bmatrix} = 0$$

FIG. 1C

$$\begin{array}{c} A \quad B \quad C \quad D \\ \downarrow \quad \downarrow \quad \downarrow \quad \downarrow \\ [\, 1 \quad 0 \quad 0 \quad 1 \,] \\ = \\ [\, C_0 \quad C_1 \quad C_2 \quad C_3 \quad C_4 \quad C_5 \quad C_6 \,] \\ \cdot \\ \begin{bmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \\ 1 & 1 & 1 & 0 & 0 & 0 & 0 \\ 1 & 0 & 0 & 1 & 0 & 1 & 0 \\ 0 & 1 & 0 & 1 & 0 & 0 & 1 \\ 0 & 0 & 1 & 1 & 1 & 0 & 0 \end{bmatrix} \\ H \cdot c^T = \end{array}$$

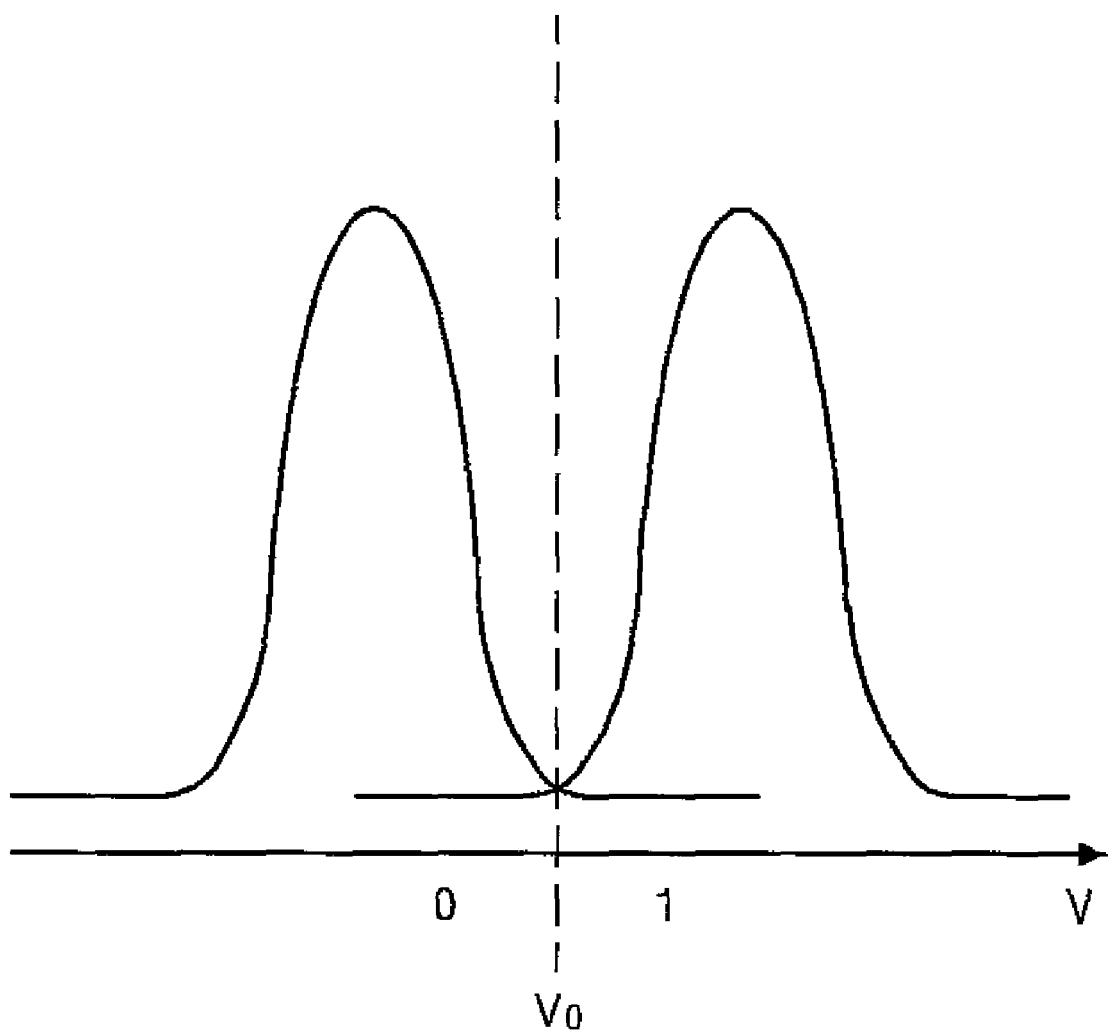

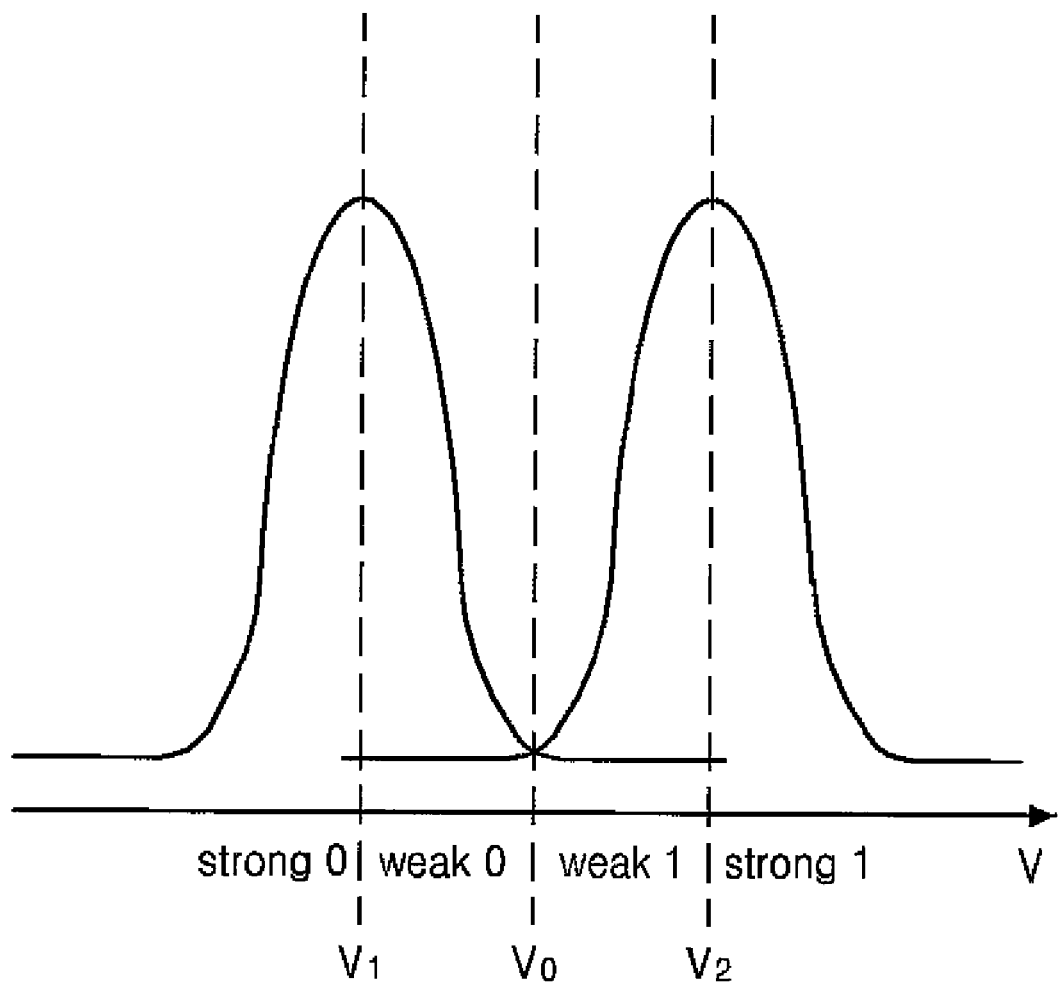

METHOD OF ESTIMATING AND CORRECTING ERRORS IN MEMORY CELLS

CROSS-REFERENCE TO RELATED APPLICATIONS

A claim of priority is made to Korean Patent Application No. 10-2008-0107889, filed Oct. 31, 2008, in the Korean Intellectual Property Office, the subject matter of which is hereby incorporated by reference.

BACKGROUND

The present inventive concept relates to memory cells, and more particularly to estimating and correcting errors in memory cells.

Multi-Level Cells (MLCs) capable of programming data in at least two level states have been actively studied to address demand for increased amounts of data to be processed by individuals or groups. Each of the levels that constitute an MLC may be set to have a certain voltage range during programming. Thus, during data read-out, data programmed in a specific memory cell may be read using a voltage range corresponding to each of the levels.

However, data stored in a memory cell may be affected by the external environment (e.g., variations in temperature, time, coupling, disturbances, loss of charges, or the like), and thus the level of voltage stored in each cell may vary. In other words, when data is read from a data cell programmed in a first state, variations in the voltage level may result in the data being read erroneously in a second state instead of the first state. Such errors in memory read-out decrease reliability of the memory device.

SUMMARY

Exemplary embodiments of the present inventive concept provide a method of estimating errors and a method of correcting the errors, by which cells in which errors may be generated can be more accurately estimated and the errors can be corrected.

According to exemplary embodiment of the present inventive concept, there is provided a method for estimating and correcting errors in memory cells, implemented by at least an error correction code (ECC) decoder and a controller. The method includes identifying a first candidate group of memory cells having an error-generation possibility using a first method for error estimation; identifying a second candidate group of memory cells having an error-generation possibility using a second method for error estimation; and correcting errors in at least one cell commonly included in the first and second candidate groups.

The first method may be one selected from a group consisting of a method using a parity check matrix, a method using a degree of coupling of each cell, and a method using additional read-out of each cell. The second method may be another one selected from a group consisting of the method using the parity check matrix, the method using the degree of coupling of each cell, and the method using additional read-out of each cell.

Correcting the errors may include performing bit-flipping on the at least one cell commonly included in the first and second candidate groups, or erasing the at least one cell commonly included in the first and second candidate groups. The method using the parity check matrix may identify the at least one cell not satisfying a condition of $H \cdot cT = 0$, where H denotes a parity check matrix and c denotes a codeword vector.

The method may further include performing ECC decoding on multiple cells including the at least one error-corrected cell, and determining whether the ECC decoding has failed. When it is determined that the ECC decoding has failed, the identifying of the first and second candidate groups and the correcting of errors in at least one cell commonly included in the first and second candidate groups may be repeated.

According to exemplary embodiment of the present inventive concept, there is provided a method for estimating and correcting errors in memory cells, implemented by at least an ECC decoder and a controller. The method includes identifying a first candidate group of memory cells having an error-generation possibility using a first method for error estimation; identifying a second candidate group of memory cells from the first candidate group having an error-generation possibility using a second method for error estimation; and correcting errors in the second candidate group. The first method may be one selected from the group consisting of a method using a parity check matrix, a method using coupling degree of each cell, and a method using additional read-out of each cell. The second method may be another selected from the group consisting of the method using the parity check matrix, the method using the coupling degree of each cell, and the method using additional read-out of each cell.

BRIEF DESCRIPTION OF THE DRAWINGS

Illustrative embodiments of the inventive concept will be described in further detail with reference to the attached drawings, in which:

FIG. 1A shows a relationship between a parity check matrix and a codeword vector for error estimation, according to an exemplary embodiment of the present inventive concept;

FIG. 1B shows an example in which the parity check matrix illustrated in FIG. 1A is implemented in a cyclic code, according to an exemplary embodiment of the present inventive concept;

FIG. 1C shows a relationship between the parity check matrix and the codeword vector and a method of detecting an error candidate group, according to an exemplary embodiment of the present inventive concept;

FIG. 3A is a graph showing an illustrative reading method using hard division;

FIG. 3B is a graph showing additional read-out for error estimation, according to an exemplary embodiment of the present inventive concept;

DETAILED DESCRIPTION OF THE EMBODIMENTS

Figure 2:
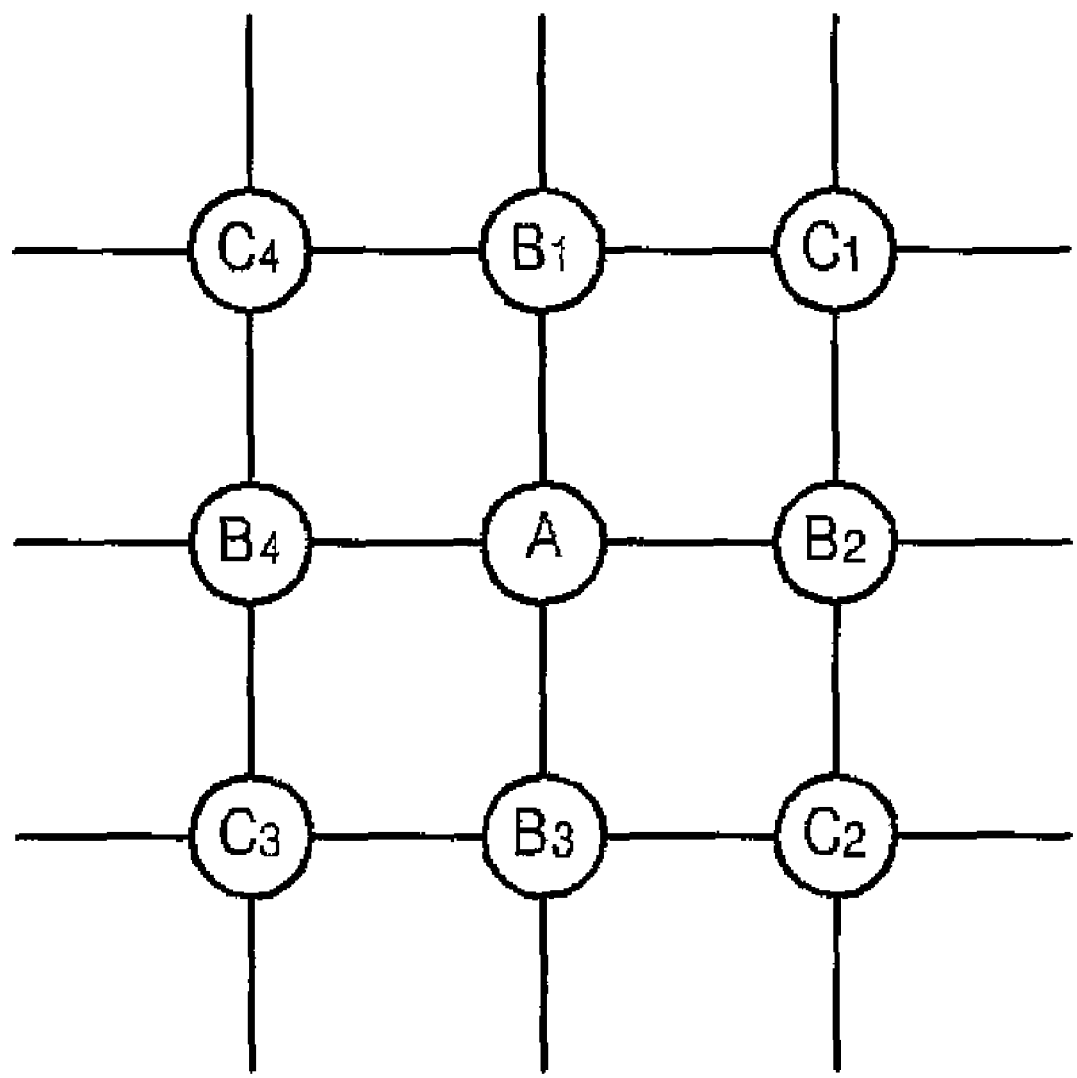
FIG. 2 is a block diagram showing coupled cells for error estimation, according to an exemplary embodiment of the present inventive concept.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

FIG. 1A shows an equation illustrating a relationship between a parity check matrix H and a codeword vector c for error estimation, according to an exemplary embodiment of the present inventive concept.

The parity check matrix H represents a parity check of a linear code. Components $h_{00}$ through $h_{M-1\ n-1}$ of the parity check matrix H may be based on the characteristics of error correction code (ECC). Components $c_0, c_1, c_2 \ldots,$ and $c_{n-1}$ of the codeword vector c may include at least one message information and at least one parity bit.

Rows of the parity check matrix H may be represented as coefficients of an equation that represents a parity check, and a necessary and sufficient condition for the codeword vector c to become a codeword of a linear code is $H \cdot c^T = 0$, where T denotes a transpose matrix. For example, row vectors (for example, $h_0 = \{h_{00}, h_{01} \ldots h_{0n-1}\}, h_1 = \{h_{10}, h_{11} \ldots h_{1n-1}\}$, or the like) of the parity check matrix H may be linearly independent from one another.

Accordingly, when an error estimation and correction method according to an embodiment is implemented using a linear code, it may be determined that no errors are generated in data programmed in a memory device or the number of generated errors is less than or equal to a predetermined value, if the condition shown in FIG. 1A is satisfied. For example, in FIG. 1A, the parity check matrix H may have a size of M×n (for example, M and n are natural numbers), and the codeword vector c may have a size of n×1.

A parity-check equation of $h_{i\ 0} * c_0 + h_{i\ 1} * c_1 + h_{i\ 2} * c_2 + \ldots + h_{i\ n-2} * c_{n-2} + h_{i\ n-2} * c_{n-1} = 0$ may be derived from an i-th row, and thus M parity-check equations may be obtained from the equation of FIG. 1A. By determining whether each of the M parity-check equations satisfies the condition shown in FIG. 1A, a candidate group having a high possibility that errors are generated may be identified. An error estimating method using such a parity-check equation will be described below with reference to FIG. 1C.

FIG. 1B illustrates an example in which the parity check matrix H illustrated in FIG. 1A is implemented in a cyclic code, according to an exemplary embodiment of the present inventive concept. Since the error estimation and correction method according to an exemplary embodiment is applied to a case of using general linear block codes as in FIG. 1A, the error estimation and correction method may also be applied to a case of using a cyclic code.

The cyclic code may include, for example, a Reed-Solomon (RS) code, a Bose Chaudhuri Hocquenghem (BCH) code, etc. When the error estimation and correction method is performed using a cyclic code, the parity check matrix H may be represented as in FIG. 1B. In FIG. 1B, n denotes the size of a codeword, and k denotes the size of a message.

Each row of the parity check matrix for the cyclic code of FIG. 1B may include (k+1) components $h_k$ through $h_0$ from which at least one component is not 0, and (n−k−1)=0. The rows may commonly include (k+1) components $h_k$ through $h_0$ from which at least one component is not 0. As described above, the error estimation and correction method according to exemplary embodiments may be applied to both a linear code and a cyclic code. The parity check matrix H for the linear code of FIG. 1A will now be illustrated to demonstrate the error estimation and correction method, according to various exemplary embodiments.

FIG. 1C illustrates a relationship between the parity check matrix H and the codeword vector c and a method of detecting an error candidate group having a high possibility that errors are generated, according to various exemplary embodiments. In FIG. 1C, four parity check equations may be derived. For example, equation A is $c_0 + c_2 + c_4 + c_6 = 1$, equation B is $c_0 + c_1 + c_5 = 0$, equation C is $c_1 + c_2 + c_3 + c_6 = 0$, and equation D is $c_3 + c_4 + c_5 + c_6 = 1$. As described above, if the value of a parity check equation is 0, it is estimated that no errors are generated. If the value of a parity check equation is 1, it is estimated that errors are generated. In FIG. 1C, since equations A and D do not satisfy the condition proposed in FIG. 1A, it may be estimated that errors are generated in a component commonly included in equations A and D, that is, in component $c_4$ or $c_6$.

Alternatively, in various exemplary embodiments, it may be set that if an equation having a value equal to or greater than a critical value from among parity check equations related to a specific bit does not satisfy the condition proposed in FIG. 1A, the possibility that errors are generated in the specific bit is high.

FIG. 2 illustrates coupling of cells of a memory device for error estimation, according to an exemplary embodiment of the present inventive concept. The memory device may include multiple cells formed at intersections between word lines and bit lines, and each of the cells may include a transistor and a capacitor, for example. Data may be programmed in each of the cells by applying a voltage corresponding to the value of data desired to be programmed to a capacitor included in each of the cells. However, when a cell is programmed, coupling due to a parasite capacitor occurs between cells adjacent to the programmed cell. Consequently, the value of a voltage of a previously-programmed cell is affected by a program operation on cells adjacent to the previously-programmed cell. For example, if cell A is a previously-programmed cell in FIG. 2, the voltage value of cell A may vary according to program operations on cells B1 through B4 horizontally and vertically adjacent to the cell A and on cells C1 through C4 diagonally adjacent to the cell A.

A variation of the value of a voltage applied to a cell may be proportional to that of a voltage of a cell adjacent to it. Accordingly, the degree of coupling of a central cell (for example, cell A in FIG. 2) may be ascertained by measuring the variations of the voltages of the cells adjacent to the central cell. In various exemplary embodiments, cells having coupling degrees that exceed a predetermined value may be classified as cells having a high possibility of error generation. Thus, a candidate group having a high error-generation possibility may be identified by measuring the coupling degree of each cell using programming information of its neighboring cells.

FIG. 3A is a graph illustrating a reading method using a hard decision and FIG. 3B is a graph illustrating an additional read-out, according to an exemplary embodiment of the present inventive concept. According to the hard decision, only a voltage $V_0$ may be used as a reference voltage for distinguishing level "0" from level "1". Thus, a reading circuit (not shown) may determine a read-out voltage value to have level "1" when the read-out voltage value is greater than voltage $V_0$, and determine the read-out voltage value to have level "0" when the read-out voltage value is less than voltage $V_0$. However, as illustrated in FIG. 3A, a voltage range corresponding to level "0" may partially overlap a voltage range corresponding to level "1", and thus when the read-out voltage value exists in the overlapping region of the voltage ranges, the possibility that read errors are generated is high.

FIG. 3B is a graph illustrating an additional read-out based on soft decision in order to improve the reading method using the hard decision illustrated in FIG. 3A, according to an exemplary embodiment of the present inventive concept.

In an example of the soft decision, as illustrated in FIG. 3B, in addition to voltage $V_0$, voltages $V_1$ and $V_2$ may be used as reference voltages for distinguishing level states from one another, and thus a reading circuit (not shown) may distinguish a total of four level states from one another, including "strong 0", "weak 0", "weak 1" and "strong 1". Further, when the number of additional read-out operations is increased, more level states than the four level states depicted in FIG. 3B may be distinguished from one another. Thus, cells existing in boundary areas between adjacent level states (for example, cells having read-out voltage values ranging in between voltages $V_1$ and $V_2$) may be ascertained using an addition read-out operation and may be classified into cells having high error-generation possibilities.

Various methods of identifying at least one cell having a high error-generation possibility from cells included in a memory device have been described above. FIGS. 1A through 1C illustrate a method using a parity check matrix, FIG. 2 illustrates a method based on the coupling degree of each cell, and FIGS. 3A and 3B illustrate a method using an additional reading operation.

Processes for combining the various methods of identifying cells having a high error-generation possibility from the cells included in a memory device, and for correcting errors in the identified cells are described below.

Figure 4A:
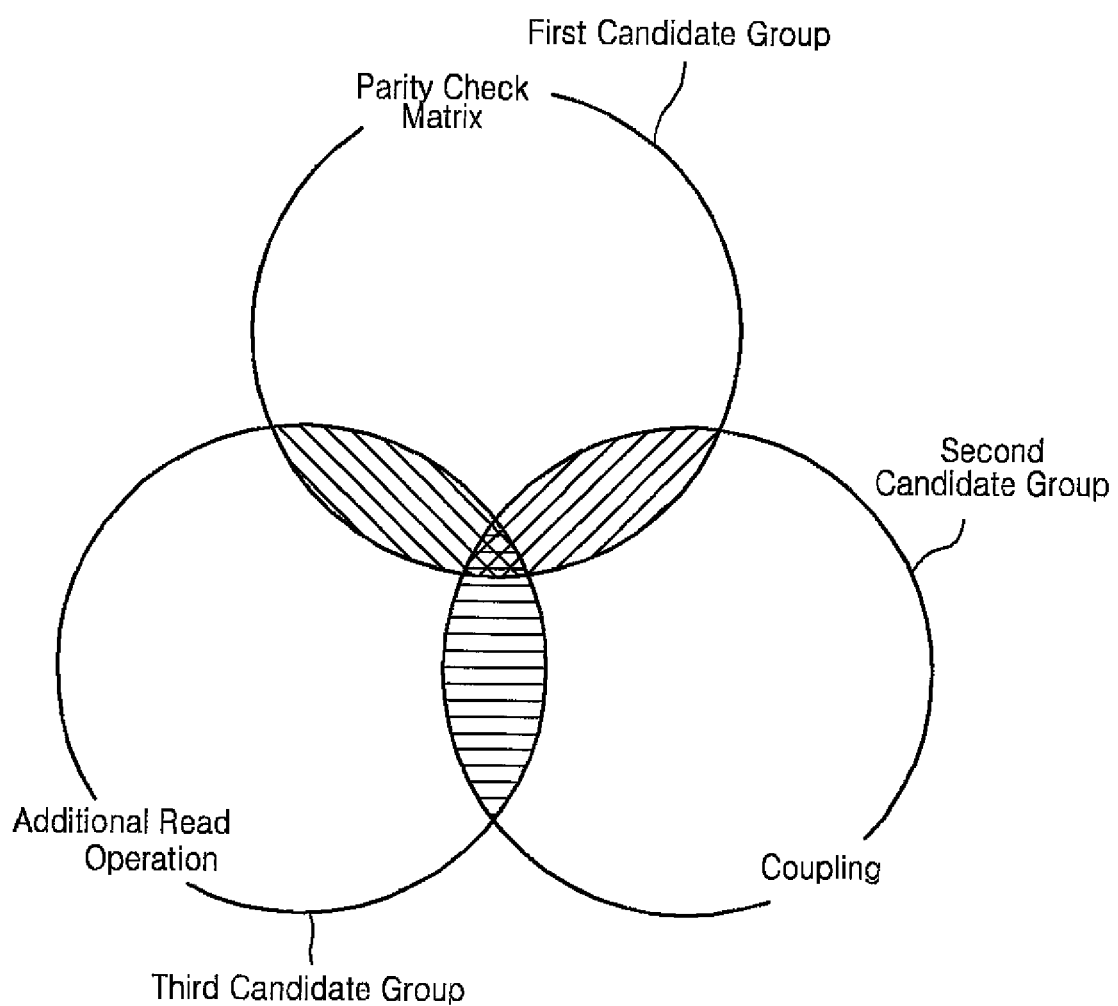
FIG. 4A is a diagram showing a method of identifying a candidate group in which errors may be generated, according to an exemplary embodiment of the present inventive concept.
Figure 4B:
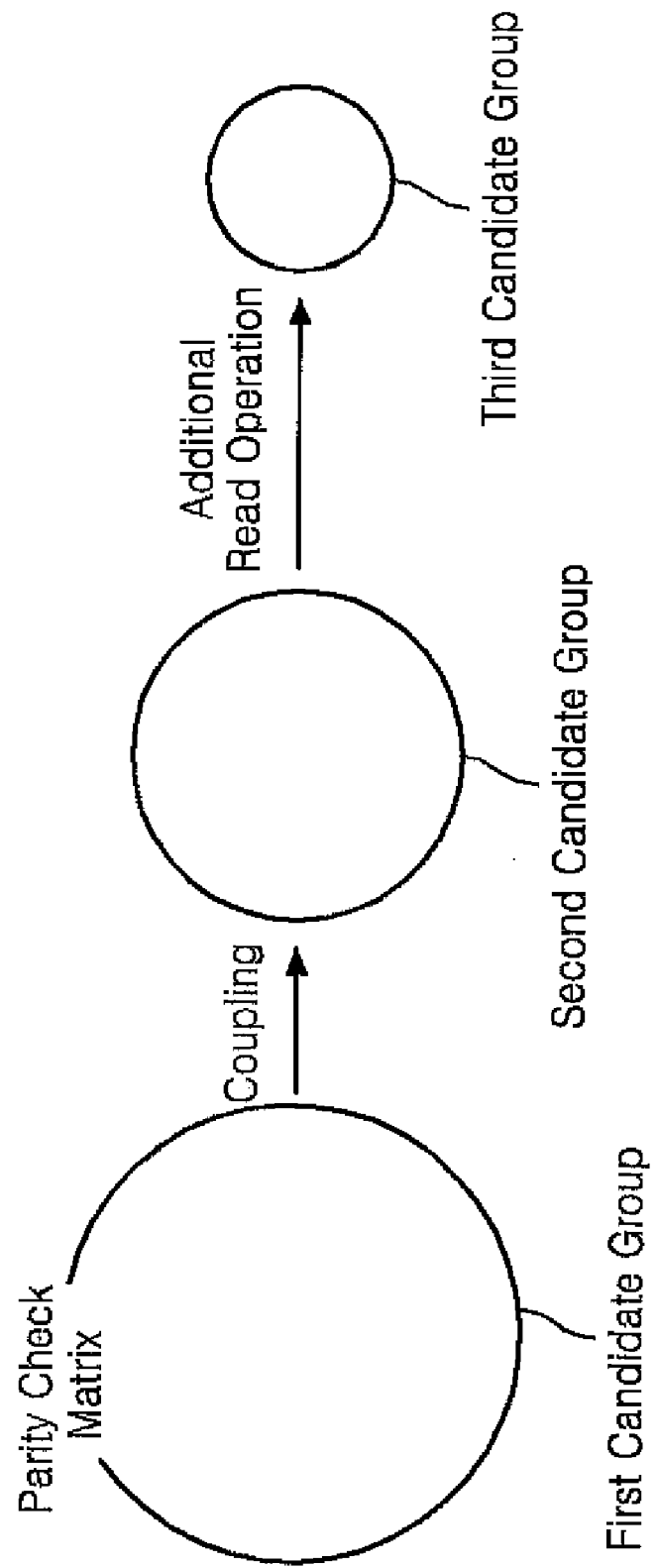
FIG. 4B is a diagram showing a method of identifying a candidate group in which errors may be generated, according to another exemplary embodiment of the present inventive concept.

FIG. 4A is a diagram illustrating a method of identifying a candidate group in which errors may be generated, according to an exemplary embodiment of the present inventive concept. FIG. 4B is a diagram illustrating a method of identifying a candidate group in which errors may be generated, according to another exemplary embodiment of the present inventive concept.

FIG. 4A illustrates an example in which the above-described methods of identifying cells having a high error-generation possibility are applied to all cells included in a memory area from which data is to be read. For example, a first candidate group having a high error-generation possibility may be identified from among all of the cells included in the memory area from which data is to be read, using a parity check matrix. Similarly, a second candidate group having a high error-generation possibility may be identified from among all of the cells included in the memory area from which data is to be read, using the coupling degrees of all of the cells of the memory area, and a third candidate group having a high error-generation possibility may be identified by performing an additional read-out (additional read operation) on all of the cells included in the memory area from which data is to be read.

The first, second and third candidate groups may be identified using the three representative methods described above, and overlapped areas between adjacent candidate groups may be estimated to have a high error-generation possibility, so that the overlapped areas are subjected to error correction according to various exemplary embodiments. In other words, cells commonly belonging to two candidate groups may be subject to error correction. In various exemplary embodiments, only cells commonly belonging to all of the three candidate groups are subject to error correction. Of course, in various embodiments, other methods of identifying error possibilities may be incorporated to identify corresponding candidate groups, and more or less than three candidate groups may be formed and used to identify cells to be error-corrected, without departing from the scope of the present teachings.

FIG. 4B illustrates a method in which final cells to be error-corrected are identified by incrementally downsizing an initial candidate group using subsequently formed candidate group(s) from the initial candidate group. The method of FIG. 4B may be suitable for an application which is limited in an arithmetic operation capability or time, for example.

More particularly, first, a first candidate group having a high error-generation possibility is identified from among all of the cells included in the memory area from which data is to be read, for example, using a parity check matrix. Then, a second candidate group is identified from among cells of the first candidate group, for example, by measuring the coupling degrees of cells included in the first candidate group. Thereafter, a third candidate group is identified from among cells of the second candidate group, for example, by performing an additional read-out on the cells included in the second candidate group. Although FIG. 4B illustrates a candidate group in which errors may be generated is reduced in size by sequentially performing the method using a parity check matrix, the method based on the coupling degree of each cell, and the method using the additional reading operation, the number and order in which the various methods are performed may vary without departing from the scope of the present teachings.

Figure 5:
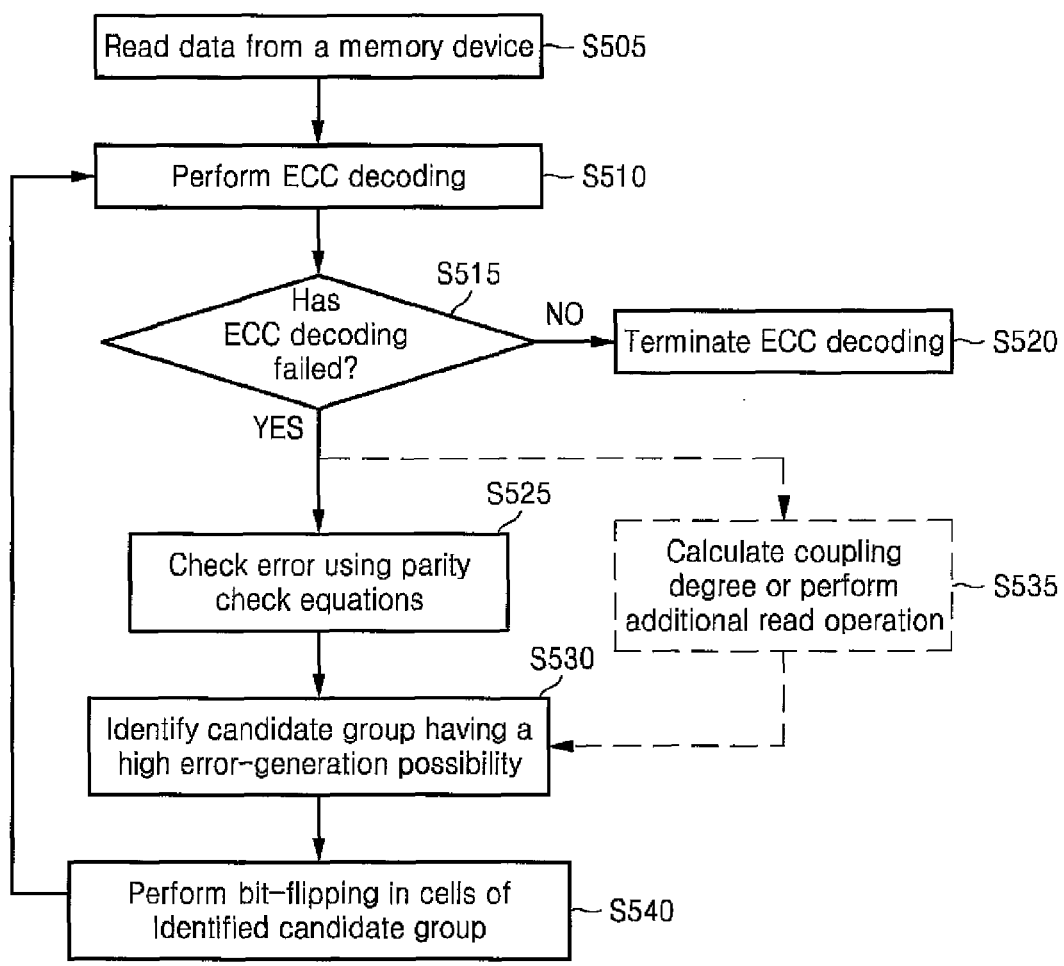
FIG. 5 is a flowchart showing an error estimation and correction method, according to an exemplary embodiment of the present inventive concept.

FIG. 5 is a flowchart of an error estimation and correction method, according to an exemplary embodiment of the present inventive concept. First, in operation S505, a reading circuit (not shown) reads data from a memory device in response to a read command received from an external source (for example, a memory controller). Then, in operation S510, the read-out data is subject to error correction code (ECC) decoding.

In operation S515, it is determined whether the ECC decoding has failed. More particularly, a linear code or a cyclic code has corresponding unique error correction capability. For example, if a BCH code has an error correction capability in which t=24 and n=4096, the ECC decoding may be successful only when erroneous data from among 4096 bits are less than or equal to 24 bits.

When it is determined in operation S515 that the ECC decoding has not failed, for example, if the number of bits of erroneous data is less than or equal to 24 bits in BCH code, corresponding to the error correction capability, the ECC decoding may be concluded in operation S520. On the other hand, when it is determined in operation S515 that the ECC decoding has failed, for example, if the number of bits of erroneous data exceeds 24 bits, error estimation and correction is performed according to the exemplary embodiment of FIG. 5. In operation S525, errors are checked using parity check equations. In operation S530, a candidate group having a high error-generation possibility is identified. Also, in operation S535, the coupling degree of each cell of the memory device may be ascertained and/or each cell may be additionally read, as described above. Thus, in operation S530, a final candidate group having a high error-generation possibility is obtained based on the parity check equations, the coupling degree and/or results of the additional reading.

Then, in operation S540, once the final candidate group having a high error-generation possibility is obtained, each cell included in the final candidate group is subject to corrective action, such as bit flipping. For example, information of the cells included in the final candidate group indicating "0" is changed to "1", and information of the cells included in the final candidate group indicating "1" is changed to "0". The process then returns to operation S510, and the ECC decoding is performed again on the memory, including the cells of the final candidate group subjected to the bit flipping. If the bit flipping is successful, it may be determined in operation S515 that the ECC decoding has not failed and the ECC decoding is terminated in operation S520. Otherwise, the remainder of the process is repeated.

Figure 6:
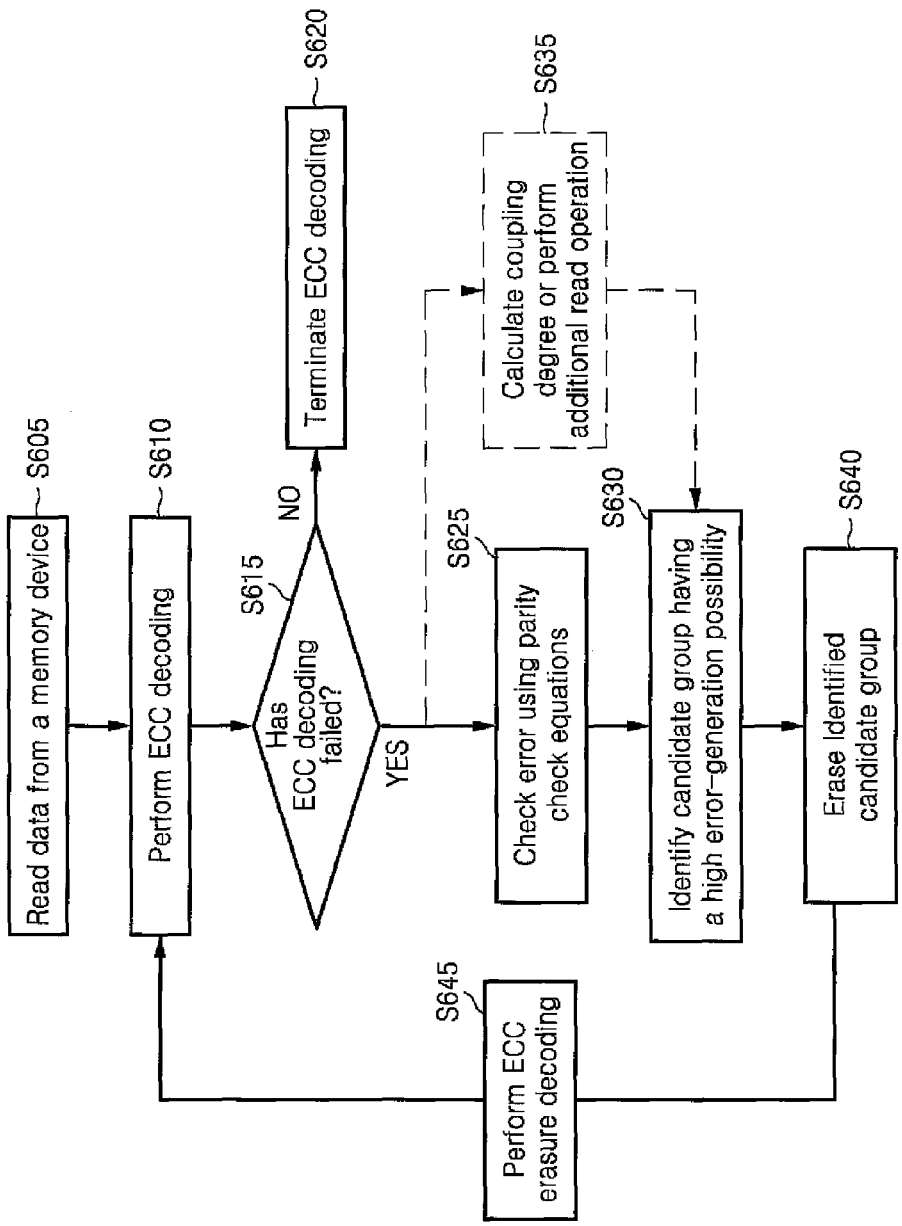
FIG. 6 is a flowchart showing an error estimation and correction method, according to another exemplary embodiment of the present inventive concept.

FIG. 6 is a flowchart of an error estimation and correction method, according to another exemplary embodiment of the present inventive concept. First, in operation S605, a reading circuit (not shown) reads data from a memory device in response to a read command received from an external source (for example, a host). Then, in operation S610, the read-out data is subject to ECC decoding. At this time, in operation S615, it is determined whether the ECC decoding has failed. When it is determined in operation S615 that the ECC decoding has not failed, for example, if the number of bits of erroneous data is less than or equal to 24 bits, corresponding to the error correction capability, the ECC decoding may be concluded, in operation S620.

On the other hand, when it is determined in operation S615 that the ECC decoding has failed, for example, if the number of bits of erroneous data exceeds 24 bits, error estimation and correction is performed according to the exemplary embodiment of FIG. 6. In operation S625, errors are checked using parity check equations. In operation S630, a candidate group having a high error-generation possibility is identified. Also, in operation S635, the coupling degree of each cell of the memory device may be ascertained and/or each cell may be additionally read, as described above. Thus, in operation S630, a final candidate group having a high error-generation possibility is obtained based on the parity check equations, the coupling degree and/or results of the additional reading.

Then, in operation S640, once the final candidate group having a high error-generation possibility is obtained, each cell included in the final candidate group may be subject to erasure. More particularly, a value (for example, "e") between "0" and "1" may be designated to each of the cells included in the final candidate group. After the cells of the final candidate group are erased, the process returns to operation S610, and the ECC decoding is performed again on the memory, excluding the erased cells of the final candidate group. When it is determined in operation S615 that the ECC decoding has not failed, the ECC decoding is terminated in operation S620. Otherwise, the remainder of the process is repeated.

In various exemplary embodiments, the ECC decoding subsequently performed in operation S610 may be successful after simply performing erasure on the final candidate group, e.g., in operation S640. In this case, ECC erasure decoding depicted in operation S645 may be omitted. However, when a condition of the ECC decoding is not satisfied by the erasure performed on the final candidate group in operation S640, ECC erasure decoding may be performed in operation S645 in the error estimation and correction method according to the exemplary embodiment of FIG. 6.

For example, operation S645 may perform ECC erasure decoding by applying a "trial and error" method to each of the cells subjected to the erasure. More particularly, a value of "0" or "1" may be designated to each of the cells subjected to the erasure. For example, when four cells are identified as the final candidate group having a high error-generation possibility, various combinations of "0" or "1" may be designated for each of the four cells for ECC decoding. Thus, for four erased cells, determinations of success or failure of the ECC decoding may be performed on 16 cases (i.e., $2^4$).

Figure 7:
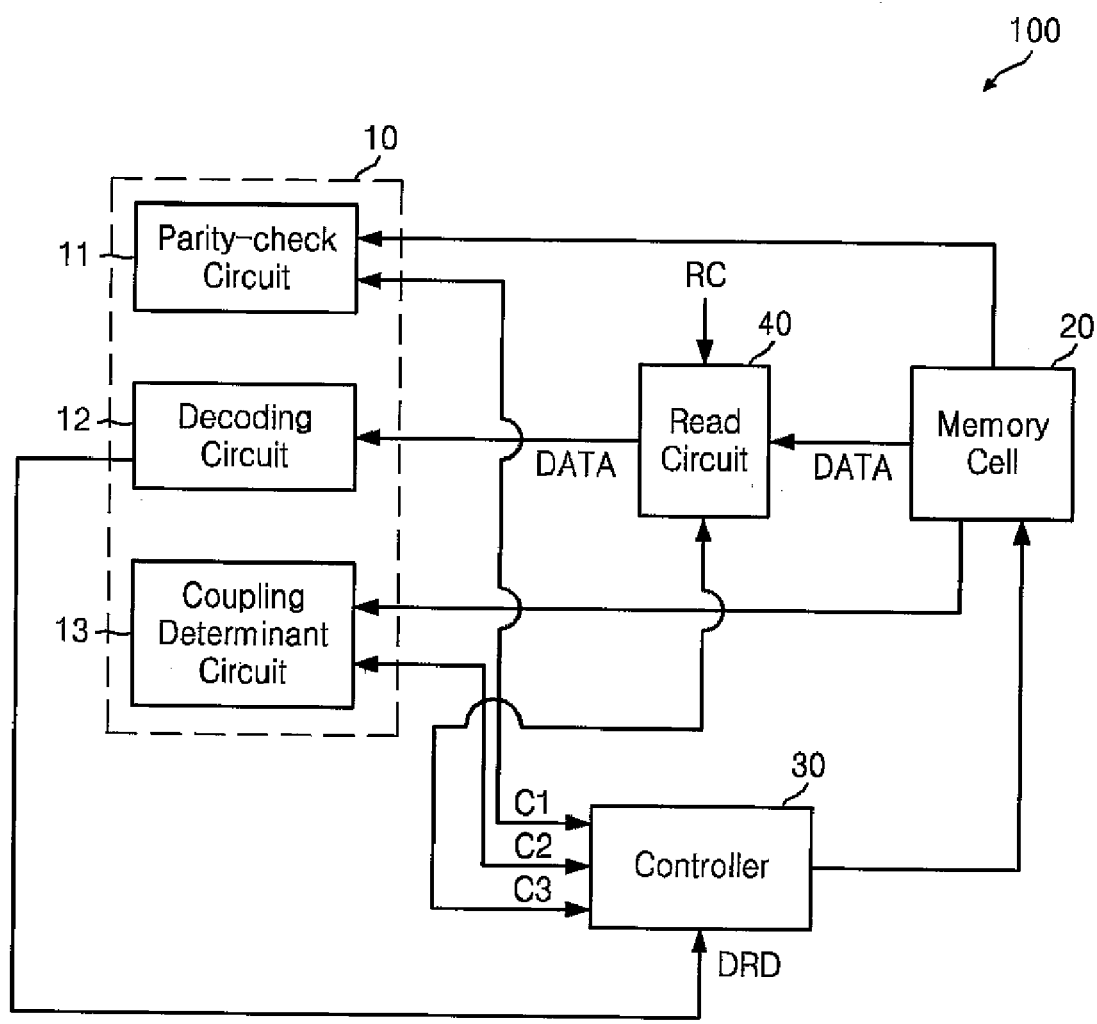
FIG. 7 is a schematic block diagram of a memory device, according to an exemplary embodiment of the present inventive concept.

FIG. 7 is a schematic block diagram of a memory device 100, according to an exemplary embodiment of the present inventive concept. The memory device 100 includes an ECC decoder 10, a memory cell 20 including multiple cells, a controller 30, and a read circuit 40. The read circuit 40 reads data DATA included in the memory cell 20 in response to a read command RC output from an external source (for example, a host) or from the controller 30, and transmit the read-out data DATA to the ECC decoder 10.

In the depicted embodiment, the ECC decoder 10 includes a decoding circuit 12 for performing ECC decoding with respect to the data DATA output from the read circuit 40. The ECC decoder 10 may further include a parity-check circuit 11 for obtaining a candidate group having a high error-generation possibility from the cells included in the memory cell 20 by using a parity check matrix. The ECC decoder 10 may further include a coupling determinant circuit 13 for obtaining a candidate group having a high error-generation possibility by ascertaining the coupling degree of each of the cells included in the memory cell 20. In various exemplary embodiments, circuits for implementing other types of error estimation/detection may be included.

Although the parity check circuit 11 and the coupling determinant circuit 13 are included in the ECC decoder 10 in FIG. 7, the parity check circuit 11 and the coupling determinant circuit 13 may be located outside the ECC decoder 10 in alternative embodiments. The decoding circuit 12 performs ECC decoding and transmits data DRD corresponding to the ECC decoding to the controller 30. The data DRD may include information about whether the ECC decoding has succeeded. If the controller 30 receives information indicating that the ECC decoding has failed, the controller 30 will operate at least two from the group consisting of the parity check circuit 11, the read circuit 40, and the coupling determinant circuit 13 in order to identify a final candidate group having a high error-generation possibility.

For example, as described above, the parity check circuit 11 may identify a first candidate group having a high error-generation possibility using the parity check matrix and transmit information C1 about the identified candidate group to the controller 30. The coupling determinant circuit 13 may identify a second candidate group having a high error-generation possibility on the basis of the coupling degree of each cell and transmit information C2 about the identified candidate group to the controller 30. The read circuit 40 may identify a third candidate group having a high error-generation possibility on the basis of a result of the additional reading operation performed on each cell and transmit information C3 about the identified candidate group to the controller 30.

The controller 30 identifies cells commonly included in at least two of the three candidate groups and implements corrective action, such as performing bit flipping or erasure, on the identified cells, and updates the memory cell 20, accordingly. Then, data is read from the error-corrected memory cell 20 by the read circuit 40 and is ECC decoded by the decoding circuit 12.

Figure 8:
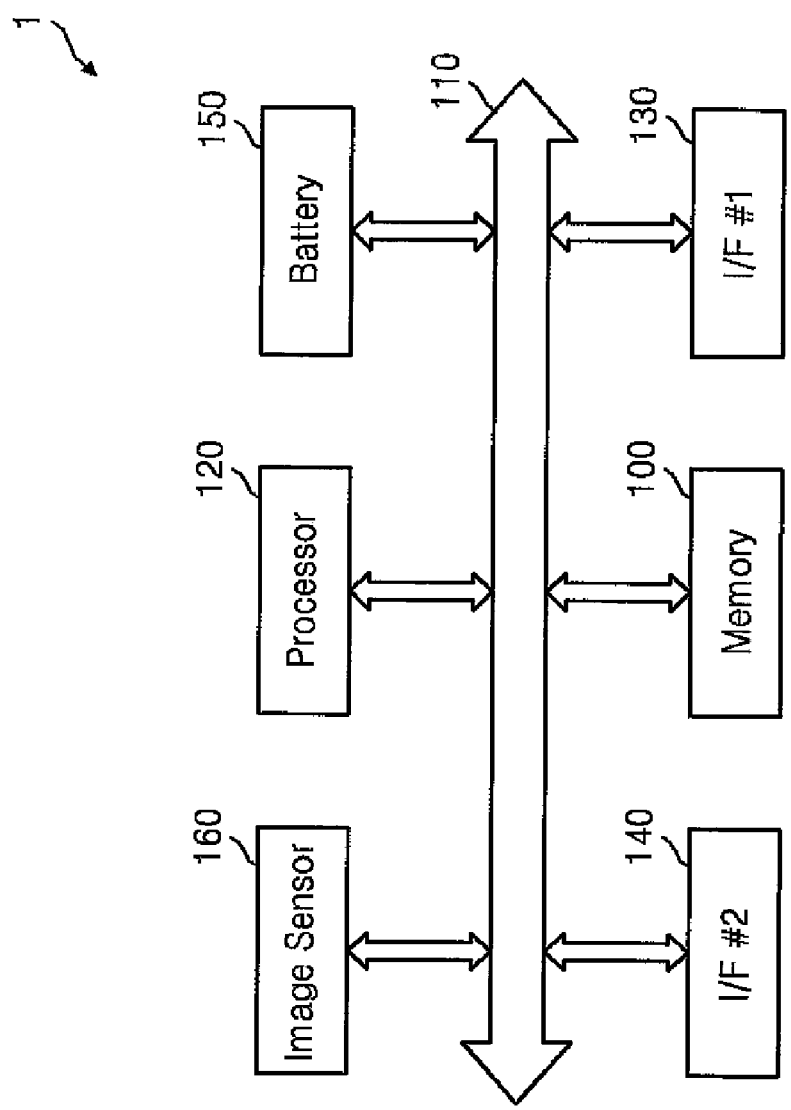
FIG. 8 is a schematic block diagram of a memory system, according to an exemplary embodiment of the present inventive concept.

FIG. 8 is a schematic block diagram of a memory system 1, according to an exemplary embodiment of the present inventive concept. Referring to FIG. 8, the memory system 1 includes the memory device 100 and a processor 120, which are connected to a system bus 110. The processor 120 may generate control signals for controlling a program operation (or a write operation), a read operation, and/or a verification operation of the memory device 100. Accordingly, a control block (not shown) of the memory device 100 may perform a program operation (or a write operation), a read operation, a verification operation, or the like in response to the control signals output by the processor 120.

Decoding methods according to the present inventive concept may be implemented in the form of program instructions capable of being executed through various computer means and may be recorded in a computer-readable recording medium. The computer-readable recording medium may also include, alone or in combination, a program instruction, a data file, a data structure, and the like.

Examples of the computer-readable recording medium include magnetic media such as hard disks, floppy disks, and magnetic tape; optical media such as CD-ROM and DVD; magneto-optical media such as floptical disks, and hardware devices that are specially configured to store and execute program instructions, such as read-only-memory (ROM), random access memory (RAM), phase-change RAM (PRAM), resistor RAM (RRAM), ferro-electric RAM (FRAM), flash memory, and the like.

In various exemplary embodiments, if the memory system 1 is implemented as a portable application, for example, the memory system 1 may further include a battery 150 for supplying operational power to the memory device 100 and the processor 120. Examples of a portable application include a portable computer, a digital camera, a personal digital assistant (PDA), a cellular telephone, an MP3 player, a portable multimedia player (PMP), an automotive navigation system, a memory card, a system card, a game player, an electronic dictionary, a solid state disk, and the like.

The memory system 1 may further include a first interface, for example, an input/output device 130, to transmit and receive data to and from an external data-processing device. If the memory system 1 is a wireless system, the memory system 1 may further include a second interface, for example, a wireless interface 140. In this case, the wireless interface 140 may be connected to the processor 120 and transmit and receive data to and from an external wireless device or network, wirelessly via the system bus 110.

The wireless system may be a wireless device (for example, a PDA, a personal computer (PC), a wireless telephone, a pager, or a digital camera), a Radio-Frequency IDentification (RFID) reader, an RFID system, or the like. The wireless system may also be a Wireless Local Area Network (WLAN) system or a Wireless Personal Area network (WPAN) system. The wireless system may also be a cellular phone network, for example.

If the memory system 1 is an image pick-up device, the memory system 1 may further include an image sensor 160, which converts an optical signal into an electrical signal. The image sensor 160 may be an image sensor using a charge-coupled device (CCD) or a CMOS image sensor manufactured using a CMOS process. In this case, the memory system 1 may be a digital camera or a mobile phone to which a digital camera is attached, for example. The memory system 1 may also be a satellite system to which a camera is attached.

In an error estimation and correction method, according to one or more exemplary embodiments of the present inventive concept, error correction is performed on cells having a high error-generation possibility using various error-estimation methods, and thus errors may be more precisely estimated and corrected.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A method for estimating and correcting errors in memory cells implemented by at least an error correction code (ECC) decoder and a controller, the method comprising:
identifying a first candidate group of memory cells having an error-generation possibility using a first method for error estimation;
identifying a second candidate group of memory cells having an error-generation possibility using a second method for error estimation different from the first method; and
correcting errors in at least one cell commonly included in the first and second candidate groups.

2. The method of claim 1, wherein the first method is one among a method using a parity check matrix, a method using a degree of coupling of each cell, and a method using additional read-out of each cell, and
wherein the second method is another one among the method using the parity check matrix, the method using the degree of coupling of each cell, and the method using additional read-out of each cell.

3. The method of claim 1, wherein correcting the errors comprises performing bit-flipping in the at least one cell commonly included in the first and second candidate groups.

4. The method of claim 1, wherein correcting the errors comprises erasing the at least one cell commonly included in the first and second candidate groups.

5. A the method of claim 2, wherein the method using the parity check matrix identifies the at least one cell not satisfying a condition of $H \cdot c^T = 0$, where H denotes a parity check matrix and c denotes a codeword vector.

6. The method of claim 1, further comprising:
performing ECC decoding on a plurality of cells including the at least one error-corrected cell; and
determining whether the ECC decoding has failed.

7. The method of claim 1, further comprising:
identifying a third candidate group of memory cells having an error-generation possibility using a third method for error estimation different from the first and second methods; and
correcting errors in at least one cell commonly included in the first, second and third candidate groups.

8. A method for estimating and correcting errors in memory cells implemented by at least an error correction code (ECC) decoder and a controller, the method comprising:
identifying a first candidate group of memory cells having an error-generation possibility using a first method for error estimation;
identifying a second candidate group of memory cells having an error-generation possibility using a second method for error estimation;
correcting errors in at least one cell commonly included in the first and second candidate groups;
performing ECC decoding on a plurality of cells including the at least one error-corrected cell; and
determining whether the ECC decoding has failed, wherein when it is determined that the ECC decoding has failed, repeating the identifying of the first and second candidate groups and the correcting of errors in at least one cell commonly included in the first and second candidate groups.

9. The method of claim 8, wherein the first method is one among a method using a parity check matrix, a method using a degree of coupling of each cell, and a method using additional read-out of each cell, and
wherein the second method is another one among the method using the parity check matrix, the method using the degree of coupling of each cell, and the method using additional read-out of each cell.

10. A method for estimating and correcting errors in memory cells implemented by at least an error correction code (ECC) decoder and a controller, the method comprising:
identifying a first candidate group of memory cells having an error-generation possibility using a first method for error estimation;
identifying a second candidate group of memory cells from the first candidate group having an error-generation possibility using a second method for error estimation different from the first method; and
correcting errors in the memory cells from the second candidate group.

11. The method of claim 10, wherein the first method is one among a method using a parity check matrix, a method using the coupling degree of each cell, and a method using additional read-out of each cell, and
wherein the second method is another one among the method using the parity check matrix, the method using the coupling degree of each cell, and the method using additional read-out of each cell.

12. The method of claim 10, further comprising:
identifying a third candidate group of memory cells having an error-generation possibility using a third method for error estimation different from the first and second methods; and
correcting errors in the memory cells from the third candidate group.

* * * * *